(12) United States Patent
Boroson et al.

(10) Patent No.: US 7,033,711 B2
(45) Date of Patent: Apr. 25, 2006

(54) APERTURE RATIO OR RESOLUTION OF AN OLED DEVICE BY LIMITING THE EDGE TAPER REGION

(75) Inventors: Michael L. Boroson, Rochester, NY (US); Giana M. Phelan, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 250 days.

(21) Appl. No.: 10/620,670

(22) Filed: Jul. 16, 2003

(65) Prior Publication Data

US 2005/0012449 A1 Jan. 20, 2005

(51) Int. Cl.
   *G03F 7/34* (2006.01)
(52) U.S. Cl. .................. 430/20; 430/200; 430/201
(58) Field of Classification Search .............. 430/20, 430/200, 201
   See application file for complete search history.

(56) References Cited

U.S. PATENT DOCUMENTS

| 5,521,035 | A | | 5/1996 | Wolk et al. | |
|---|---|---|---|---|---|
| 5,688,551 | A | * | 11/1997 | Littman et al. | 427/64 |
| 5,844,363 | A | | 12/1998 | Gu et al. | |
| 5,851,709 | A | * | 12/1998 | Grande et al. | 430/7 |
| 5,998,085 | A | * | 12/1999 | Isberg et al. | 430/200 |
| 6,358,664 | B1 | * | 3/2002 | Nirmal et al. | 430/200 |
| 6,555,284 | B1 | * | 4/2003 | Boroson et al. | 430/201 |
| 6,582,875 | B1 | | 6/2003 | Kay et al. | |
| 2002/0028626 | A1 | | 3/2002 | Lee et al. | |
| 2002/0197554 | A1 | | 12/2002 | Wolk et al. | |
| 2003/0113656 | A1 | * | 6/2003 | Tyan et al. | 430/200 |
| 2004/0067302 | A1 | * | 4/2004 | Burberry et al. | 427/66 |

FOREIGN PATENT DOCUMENTS

EP 0 883 190 A2 12/1998

* cited by examiner

*Primary Examiner*—Richard L. Schilling
(74) *Attorney, Agent, or Firm*—Raymond L. Owens (57) ABSTRACT

A method of improving the aperture ratio or resolution of an OLED device which includes a plurality of laterally spaced electrodes and one or more electrodes vertically spaced apart from the plurality of laterally spaced electrodes. The improvement includes providing a donor having transferable organic material in spaced relationship with the laterally spaced electrodes, and illuminating the donor with radiation in patterns corresponding to the area of the laterally spaced electrodes to transfer organic material over the laterally spaced electrodes such that substantially all of the organic material is transferred and the edge taper region of the organic material is less than 8 microns thereby permitting the reduction in spacing between the laterally spaced electrodes and improvement in the aperture ratio, the resolution, or both, of the OLED device.

6 Claims, 7 Drawing Sheets

APERTURE RATIO OR RESOLUTION OF AN OLED DEVICE BY LIMITING THE EDGE TAPER REGION

FIELD OF THE INVENTION

The present invention relates to improving the aperture ratio or resolution of an OLED device.

BACKGROUND OF THE INVENTION

The use of organic thin film deposition in commercial products has grown considerably over the last decade. In particular, the use of organic thin film structures in small, precise, high aperture ratio applications such as OLED displays has been of increasing commercial interest. The OLED deposition process is one example of numerous organic thin film applications and provides a good example of the requirements and limitations of conventional organic thin film disposition structures.

Conventional OLED display structures are built on a substrate in a manner such that a two-dimensional OLED pixel array is formed. Each OLED in the array includes overlying layers starting with an electrode formed on the substrate, followed by an organic electroluminescent (EL) emission medium deposited over the first electrode and an electrode on top of the EL emission layer. At least one of the electrodes is transparent. The size and shape of the organic EL medium deposit is controlled through the use of shadowmasks, which are generally metal plates with patterned apertures that cover the substrate during the deposition process. A source of organic material deposits the EL material through the aperture in the shadowmask upon the glass substrate in a pre-designed pattern of pixels. Full color displays typically comprise of red, green, and blue subpixels. For full color OLED displays some layers may be common to all subpixels (such as the hole and electron transport layers) while others may be unique to a specific color subpixel (such as the EL emission layer). For common layers, a shadowmask is often not used; if it is used, the shadowmask aperture is usually large and typically does not require highly precise tolerances. Unique layers, however, are typically deposited on individual subpixels, which are very small, and typically require highly precise tolerances to avoid deposition in adjacent subpixels of different colors. Once the deposition of EL medium is complete, the shadowmask is taken off the substrate. There are currently two primary shadowmask manufacturing techniques for producing the precision shadowmasks required for patterning fine resolution depositions: electroless plating and etching.

One specific challenge in the manufacture of OLED displays is finding a method to minimize the distance between pixels in order to maximize the quality of resolution in an OLED display as well as to enhance the flexibility of manufacturing varying sizes of OLED displays. The precision shadowmask apertures formed by electroless plating have sharp edges and corners, ideal for matching the rectangular shaped pixels of a display. These sharp edges, however, create a severe "shadowing effect" due to the varying angle of deposition, from a point source or as the linear source travels across the shadowmask, during EL medium deposition. This shadowing effect causes the thickness of the typically rectangular shaped deposition to reduce towards the edges. In contrast, the precision shadowmask apertures formed by etching have tapered edges that help minimize the shadowing effect, but the etching process also produces apertures with rounded corners that result in a deposition structure with rounded corners. When utilizing either an electroless plated or etched precision shadowmask, organic material must overlap the pixel area by an average of 15 microns in order to ensure complete pixel fill and uniform thickness in the emitting region. This overlap limits how closely pixels can be spaced together and therefore negatively effects aperture ratio.

One system of transferring organic medium upon a substrate is described in U.S. Pat. No. 5,844,363, which describes an OLED in which the hole-transporting layer, the electron transporting layer and the emissive layer, are comprised of a non-polymeric material. A method for preparing OLEDs using vacuum deposition techniques and a shadowmask are further disclosed. While U.S. Pat. No. 5,844,363 describes an improved OLED, it does not address improving OLED pixel resolution or aperture ratio, improvements in the method of manufacture of thin film structures, or improvements in either electroless plated shadowmasks or etched precision shadowmasks.

SUMMARY OF THE INVENTION

It is therefore an object of the present invention to provide an OLED device with limited edge tapers of organic layers.

This object is achieved in a method of improving the aperture ratio or resolution of an OLED device which includes a plurality of laterally spaced electrodes and one or more electrodes vertically spaced apart from the plurality of laterally spaced electrodes, the improvement comprising:

a) providing a donor having transferable organic material in spaced relationship with the laterally spaced electrodes; and b) illuminating the donor with radiation in patterns corresponding to the area of the laterally spaced electrodes to transfer organic material over the laterally spaced apart electrodes such that substantially all of the organic material is transferred and the edge taper region of the organic material is less than 8 microns thereby permitting the reduction in spacing between the laterally spaced electrodes and improve the aperture ratio or resolution of the OLED device.

ADVANTAGES

It has been determined that limited edge taper and corner radii of an organic layer, produced by using radiation thermal transfer without a shadowmask, can facilitate an increase in aperture ratio or resolution. This method also results in a more uniform film thickness within the emitting area, which provides more uniform color and light intensity within each emitting area. More uniform film thickness also results in a more uniform distribution of current within the emitting area, which prevents differential aging within the emitting area.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any hue or combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel, which can be independently addressable to emit a specific color. For example, a blue subpixel is that portion of a pixel, which can be addressed to emit blue light. In a full-color display, a pixel generally comprises three primary-color subpixels, namely blue, green, and red. For the purposes of this invention, the terms "pixel" and "subpixel" will be used interchangeably. The term "pitch" is used to designate the distance separating two pixels or subpixels in a display panel. Thus, a subpixel pitch means the separation between two subpixels.

The present invention is a method of making an organic deposition structure with sharp corners and edges, thereby minimizing the space between deposition regions and improving the resolution and aperture ratio. In a preferred embodiment of the invention, the organic deposition structure is used as part of a pixel array of an OLED display, significantly enhancing the sharpness and brightness of the picture resolution of the method formed via the OLED structures of the present invention. The method of forming and utilizing the OLED structure provides for sharper resolution without sacrificing flexibility in shape and size of OLED displays.

For a better understanding of the invention, FIGS. 1 through 6 below are provided for background, while subsequent FIGS. 7 through 9 relate to the specific embodiments of the present invention.

Figure 1:
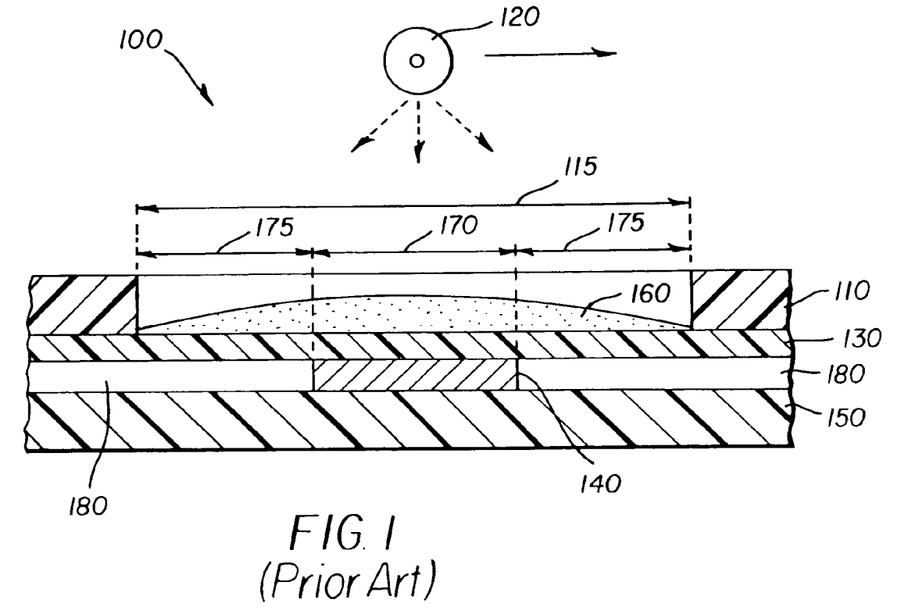
FIG. 1 is a cross-sectional view of a partial OLED device, which is representative of an OLED device formed with a conventional shadowmask (prior art)

FIG. 1 illustrates a cross sectional view of a prior art partial OLED device 100, which is representative of an OLED structure formed with a conventional shadowmask. Partial OLED device 100 is in contact with a conventional shadowmask 110 having a deposition area 115, and is in a transfer relationship with a linear source 120. Deposition area 115 is typically equal to the subpixel pitch area (subpixel horizontal pitch×subpixel vertical pitch). Partial OLED device 100 includes a hole-transporting layer (HTL) 130, an electrode 140 that is most commonly configured as an anode, a substrate 150, an organic layer 160 with a uniform region 170 surrounded by an edge taper region 175, and fill region 180. The resolution for an OLED device is the number of pixels per linear unit (such as pixels per cm or pixels per inch). The aperture ratio for an OLED device of this type is defined as the area of electrode 140 divided by deposition area 115, that is:

$$\text{Aperture ratio} = \frac{\text{Electrode 140 area}}{\text{Deposition area 115}}$$

Conventional shadowmask 110 is a conventional precision multi-aperture mask produced through electroless plating, such that the apertures have sharp edges and corners. Linear source 120 is a conventional linear organic deposition source that emits molecules of the desired deposition organic material in a radial dispersion pattern from the long axis. Hole-transporting layer 130 is a previously deposited hole-transporting layer of an OLED stack. Electrode 140 is a previously deposited pattern of laterally spaced electrodes and defines the required area for uniform deposition area of organic layer 160. Electrode 140 can be part of an active matrix device, in which each electrode 140 corresponds to a pixel. Alternatively, electrode 140 can be part of a passive array, in which one electrode 140 can activate a row of pixels. Fill region 180 is an area of fill material and other unrelated structures. Fill region 180 is the space between adjacent electrodes. For high aperture ratios or high-resolution displays, the fill region must be small. Organic layer 160 is the result of the linear source 120 emission through the aperture in conventional shadowmask 110.

In operation, linear source 120 passes over conventional shadowmask 110 at a predefined rate while emitting organic material. The emitted organic material passes through the aperture associated with deposition area 115 of conventional shadowmask 110 and is deposited upon hole-transporting layer 130, thereby forming organic layer 160. The sharp edges of conventional shadowmask 110 cause shadowing which creates a nonuniform edge taper region 175 surrounding uniform region 170 within organic layer 160.

Figure 2:
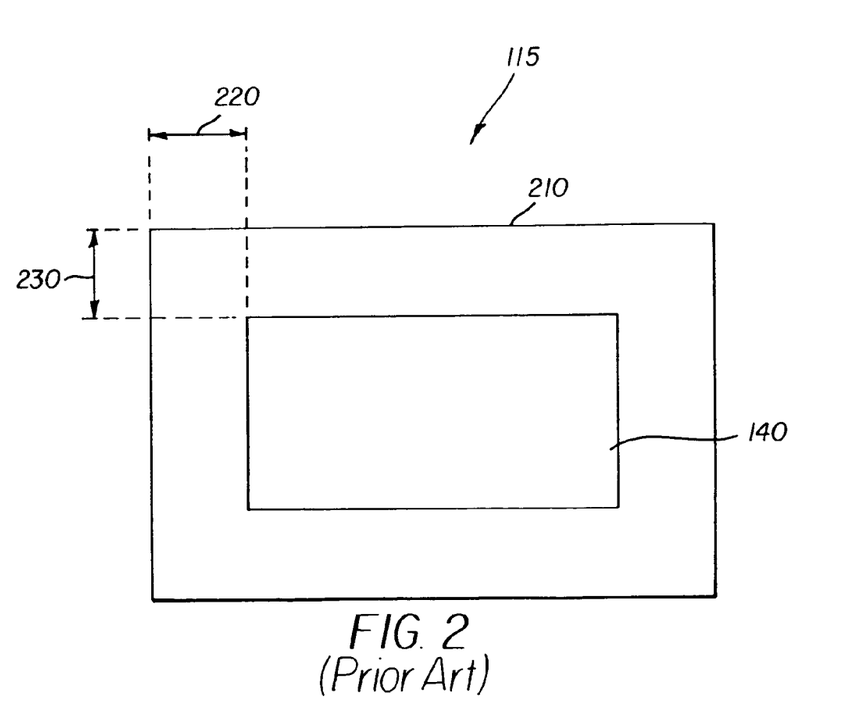
FIG. 2 is a plan view of a precision shadowmask aperture in relation to an associated electrode (prior art)

FIG. 2 is a plan view of a prior art precision shadowmask aperture 210, which is shown in relation to electrode 140. Further associated with shadowmask aperture 210 is a guardband x 220, and a guardband y 230.

FIG. 2 shows the relative position and area of an electrode 140 within precision shadowmask aperture 210. To ensure uniform deposition thickness across the area defined by electrode 140, shadowmask aperture 210 is larger than electrode 140 by the dimensions depicted as guardband x 220 and guardband y 230. Guardband x 220 and guardband y 230 must be greater than or equal to the corresponding dimensions of edge taper region 175. However, these increased dimensions limit how close multiple organic layers 160 can be placed upon hole-transporting layer 130. As a result the aperture ratio is decreased.

Figure 3A:
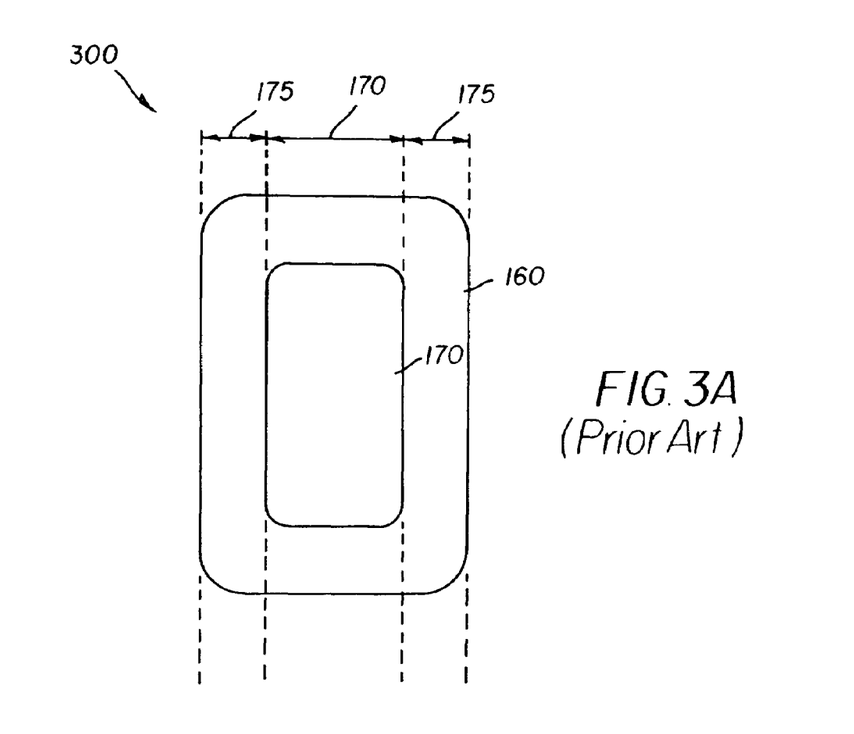
FIG. 3A is a plan view of a conventional deposition pattern formed by the above conventional shadowmask (prior art)

FIG. 3A is a plan view of a conventional deposition pattern 300 formed by the above conventional shadowmask showing organic layer 160, uniform region 170, and edge taper region 175.

Organic layer 160 represents the total area of the deposited organic EL emission medium. Edge taper region 175 is the area formed by the shadowing effect of the sharp edges of conventional shadowmask 110. Uniform region 170 is the area of organic layer 160 that is free from shadowing effects and is substantially uniform in thickness.

Figure 3B:
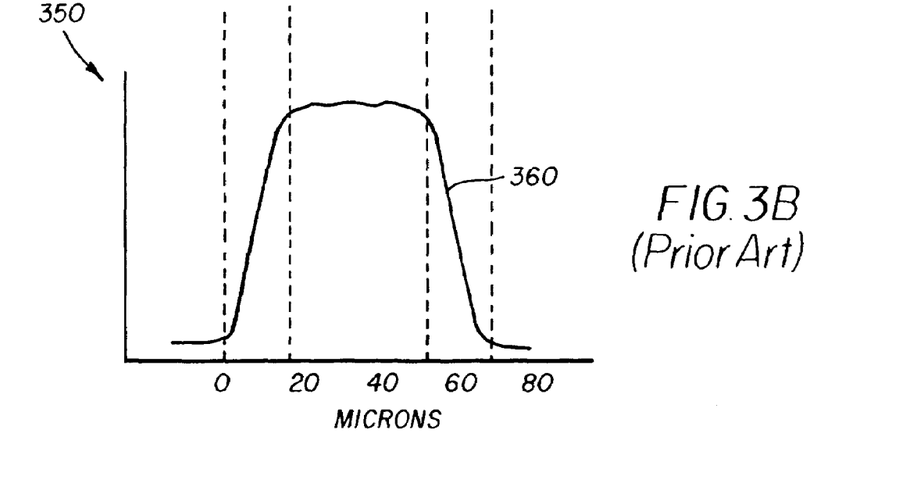
FIG. 3B is a plot of the thickness profile of an organic layer in relation to the deposition pattern of FIG. 3A (prior art)

FIG. 3B is a plot 350 that includes a profile curve 360 showing the thickness profile of organic layer 160 in relation to deposition pattern 300 of FIG. 3A. Plot 350 shows how the contrast of a deposition method or deposition pattern can be measured by the width of edge taper region 175.

Figure 4:
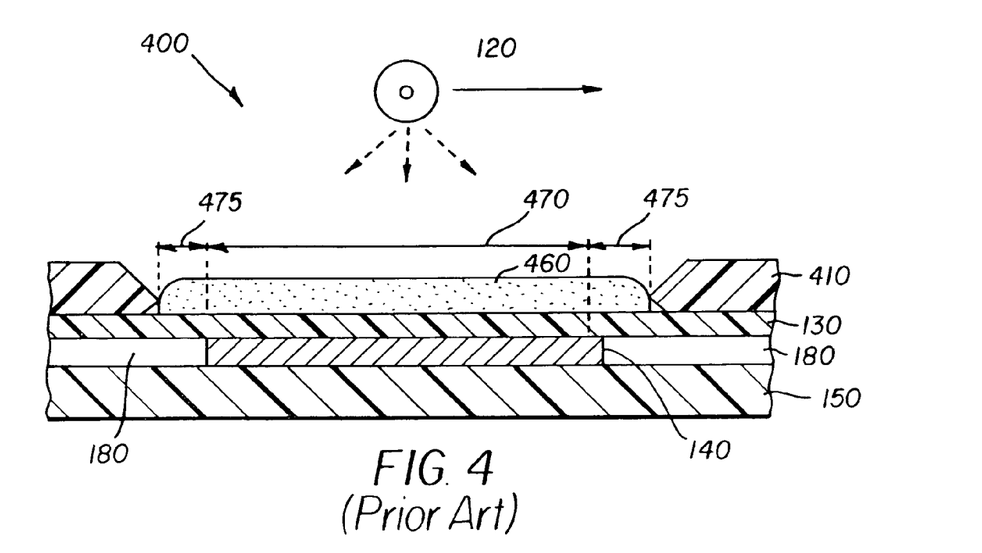
FIG. 4 is a cross-sectional view of a partial OLED device, which is representative of an OLED device formed with a tapered shadowmask (prior art)

FIG. 4 illustrates a cross-sectional view of a prior art partial OLED device 400, which is representative of an OLED structure formed with a tapered shadowmask. Partial OLED device 400 is in contact with a tapered shadowmask 410, and is in a transfer relationship with linear source 120. Partial OLED device 400 includes hole-transporting layer 130, electrode 140, substrate 150, as described above; and an organic layer 460 having a uniform region 470 surrounded by a nonuniform edge taper region 475.

Tapered shadowmask 410 is a conventional multi-aperture mask produced through etching processes such that the aperture edges have defined tapers. Electrode 140 is previously deposited and defines the required area for uniform region 470 of organic layer 460. Organic layer 460 is the result of the organic material emission of linear source 120 through the aperture in tapered shadowmask 410.

Linear source 120 operates as described above. The tapered edges of tapered shadowmask 410 minimize shadowing of the linear source 120 emission, forming nonuniform edge taper region 475. Nonuniform edge taper region 475 is smaller than edge taper region 175 of FIG. 1 because the tapered edges of tapered shadowmask 410 reduce shadowing.

Figure 5:
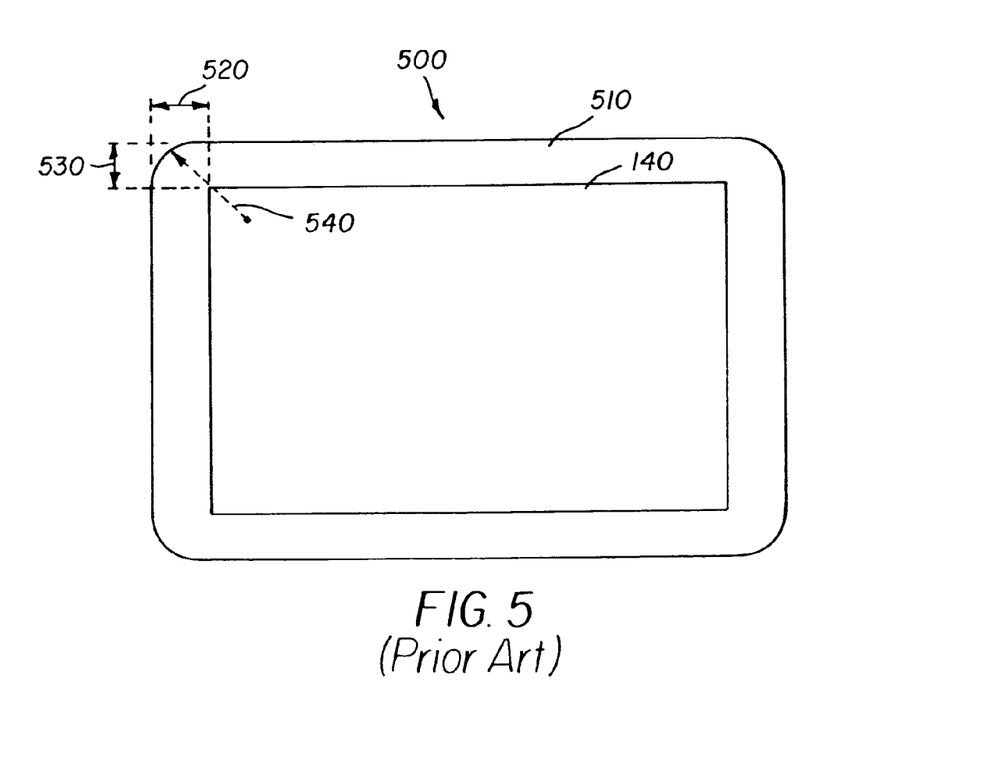
FIG. 5 is a plan view of a deposition area formed by the above associated tapered shadowmask aperture (prior art)

An artifact of the etching process used to form tapered shadowmask 410 is that the corners are rounded. FIG. 5 is a plan view of a prior art tapered shadowmask aperture 510, which is shown in relation to associated electrode 140. Further associated with tapered shadowmask aperture 510 is a guardband x 520, a guardband y 530, and a corner radius 540.

FIG. 5 shows the relative position and area of an electrode 140 within tapered shadowmask aperture 510. To ensure uniform deposition thickness across the area defined by electrode 140, shadowmask aperture 510—and therefore organic layer 460—is oversized by the dimensions depicted as guardband x 520 and guardband y 530. Guardband x 520 and guardband y 530 must be greater than or equal to the corresponding dimensions of nonuniform edge taper region 475, and must also be sufficiently large to accommodate the loss of material due to the rounded edge of corner radius 540.

Figure 6:
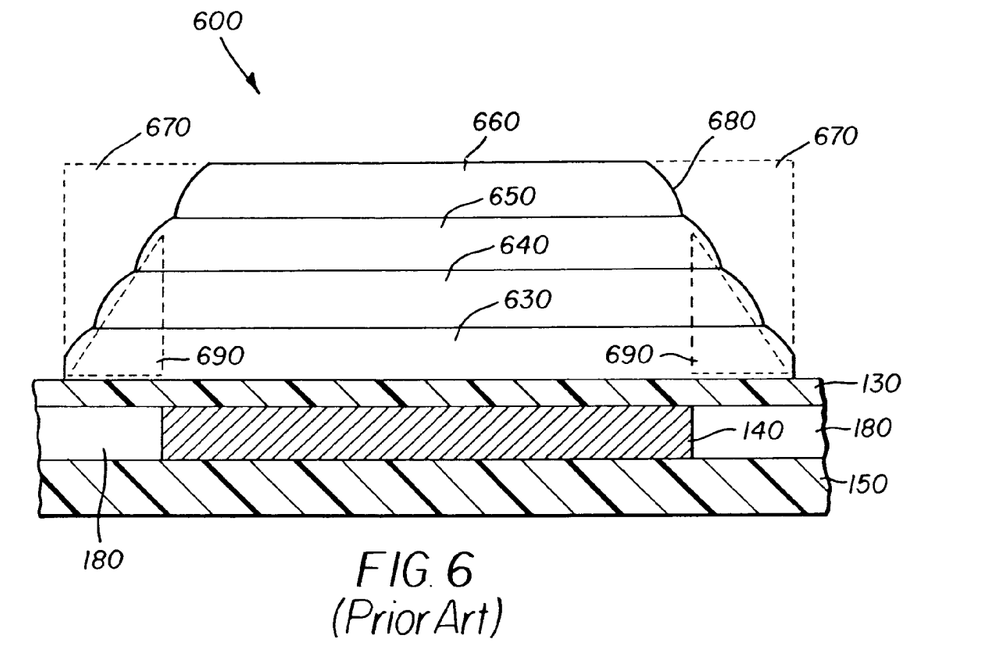
FIG. 6 shows a cross sectional view of a conventional multilayer OLED pixel formed via a conventional manufacturing process (prior art)

FIG. 6 shows a cross sectional view of a conventional (prior art) multilayer OLED pixel 600 formed via a conventional manufacturing process, such as by either an electroless plated or tapered shadowmask process. Multilayer OLED device 600 includes hole-transporting layer 130, electrode 140, substrate 150, fill region 180, organic layer 630, organic layer 640, organic layer 650, electrode 660, which is most commonly configured as a cathode, a void 670, a sloping edge 680, and an unutilized area 690. The organic layers can include light-emitting layers, an electron-transporting layer, and other optional layers that have been shown in the art to be useful in producing OLED devices. These layers are described below.

Substrate 150 can be an organic solid, an inorganic solid, or a combination of organic and inorganic solids that provides a surface for receiving organic material from a donor. Substrate 150 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 150 can be a homogeneous mixture of materials, a composite of materials, or multiple layers of materials. Substrate 150 can be an OLED substrate, that is a substrate commonly used for preparing OLED devices, e.g. active matrix low-temperature polysilicon TFT substrate. The substrate 150 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active matrix devices.

Electrode 140 is formed over substrate 150 and is most commonly configured as an anode. When EL emission is viewed through the substrate 150, electrode 140 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer be formed over electrode 140 in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

While not always necessary, it is often useful that a hole-transporting layer 130 be formed over the hole-injecting layer, or over electrode 140 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 130 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A wherein:
   $Q_1$ and $Q_2$ are independently selected aromatic tertiary amine moieties; and
   G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

B where:
   $R_1$ and $R_2$ each independently represent a hydrogen atom, an aryl group, or an alkyl group or $R_1$ and $R_2$ together represent the atoms completing a cycloalkyl group; and
   $R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

D wherein:
   each Are is an independently selected arylene group, such as a phenylene or anthracene moiety;
   n is an integer of from 1 to 4; and
   Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Organic layer 630 can be a light-emitting layer that produces light in response to hole-electron recombination. The light-emitting layer is formed over electrode 140 and over any other layers formed, such as hole-transporting layer 130. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layer of the organic EL element comprises a luminescent or fluorescent material where electroluminescence is produced as a result of electron-hole pair recombination in this region. The light-emitting layer can be comprised of a single material, but more commonly includes a host material doped with a guest compound or dopant where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine[alias, tris(8-quinolinolato)aluminum(III)]
CO-2: Magnesium bisoxine[alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato) aluminum(III)
CO-5: Indium trisoxine[alias, tris(8-quinolinolato)indium]
CO-6: Aluminum tris(5-methyloxine)[alias, tris(5-methyl-8-quinolinolato) aluminum(III)]
CO-7: Lithium oxine[alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

G where:

n is an integer of 3 to 8;

Z is O, NR or S;

R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and

L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1

L2

L3

L4

-continued

L5

L6

L7

L8

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |

-continued

| | | | |
|---|---|---|---|
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

| | R |
|---|---|
| L37 | phenyl |
| L38 | methyl |
| L39 | t-butyl |
| L40 | mesityl |

-continued

| | R |
|---|---|
| L41 | phenyl |
| L42 | methyl |
| L43 | t-butyl |
| L44 | mesityl |

L45

L46

L47

-continued

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Although not shown, the light-emitting layer can additionally comprise two or more emissive layers, if such is desired for proper emissive properties of the resulting OLED device.

An electron-transporting layer is formed over the light-emitting layer. Desired electron-transporting materials can be deposited by any suitable means such as evaporation, sputtering, chemical vapor deposition, electrochemical means, thermal transfer, or laser thermal transfer from a donor material. Preferred electron-transporting materials for use in an electron-transporting layer are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

Electrode 660 is formed over the electron-transporting layer and is most commonly configured as a cathode. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Electrode 660 is an electrode vertically spaced apart from laterally spaced electrodes 140. Electrode 660 can be part of an active matrix device and in that case is a single electrode for the entire display. Alternatively, electrode 660 can be part of a passive matrix device, in which each electrode 660 can activate a column of pixels, and electrodes 660 are arranged orthogonal to electrodes 140.

An electron-injecting layer can also be present between the cathode and the electron-transporting layer. Examples of electron-injecting materials include alkali halide salts, such as LiF mentioned above.

For prior art devices, an estimated 15 micron overlap of organic material must be used in order to completely fill in a pixel, thereby forming unutilized area 690. Any light-emitting organic material within unutilized area 690 will not emit light because the material is not in the current path defined by the surface of electrode 140. Unutilized area 690 limits the minimum spacing from one multilayer OLED pixel 600 to the next within an OLED display device, which in turn limits resolution and limits how small OLED displays can be fabricated. Furthermore, with multiple deposition layers, a pyramid effect is created due to alignment difficulties, wherein the area of organic layer 630 is larger, with the area of organic layer 640 smaller, and the area of organic layer 650 even smaller. The pyramid shape caused by the multiple stacked nonuniform layers of organic layers 630, 640, and 650 prevents multilayer OLED pixel 600 from having sharp edges that are orthogonal to substrate 150, resulting in void 670 and sloping edge 680. The pyramid effect of depositing more than one layer of organic material prevents multilayer OLED pixel 600 from having sharp corners and edges, which further limits the placement pitch of multiple multilayer OLED pixels 600 within an OLED display device.

Figure 7:
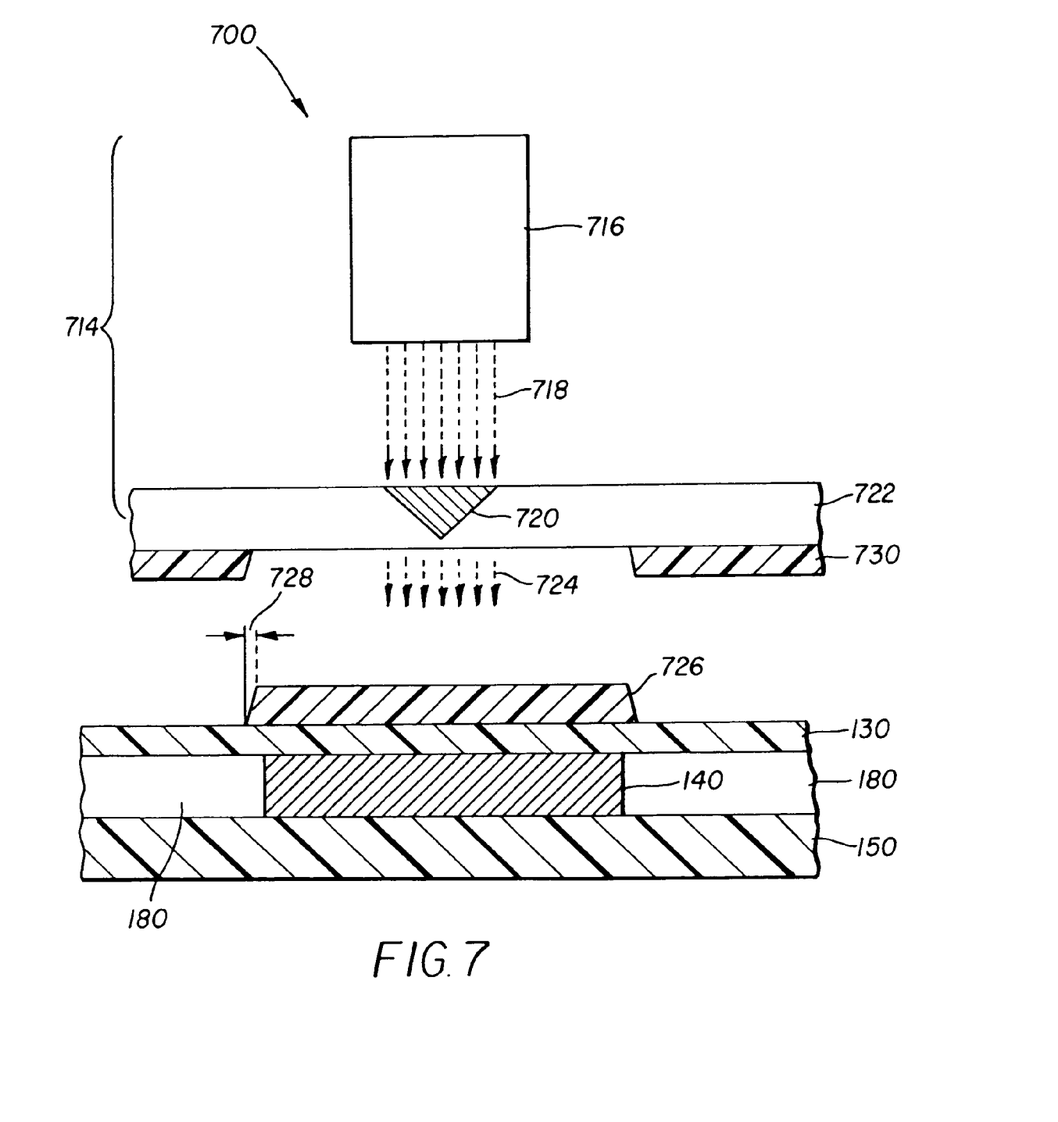
FIG. 7 illustrates a side view of a method for improving the aperture ratio of an OLED device in accordance with this invention.

FIG. 7 illustrates one method for achieving improved aperture ratio or resolution of an OLED device by limiting the edge taper region. FIG. 7 illustrates a side view of a radiation thermal transfer process 700. Radiation thermal transfer process 700 includes a radiation thermal transfer system 714 in accordance with a first embodiment of this invention. Radiation thermal transfer system 714 further includes a radiation source 716, a radiation beam 718, a radiation spot 720, and a donor 722. Radiation source 716 can be e.g. a multichannel laser printhead as described by Kay et al. in U.S. Pat. No. 6,582,875. Additionally, radiation thermal transfer process 700 includes hole-transporting layer 130, electrode 140, substrate 150, and fill region 180, as described in FIG. 1, upon which is deposited an organic layer 726 having an edge taper region 728. Further details of a radiation thermal transfer process, such as radiation thermal transfer process 700, has been described by Tang in commonly assigned U.S. Pat. No. 5,937,272. However, for better understanding of organic layer 726, it is shown in combination with radiation thermal transfer process 700 by which organic layer 726 is formed.

Donor 722 includes at the minimum a flexible donor support substrate, which can be made of any of several materials which meet at least the following requirements. The donor support substrate must be capable of maintaining the structural integrity during the light-to-heat-induced transfer step while pressurized on one side, and during any preheating steps contemplated to remove volatile constituents such as water vapor. Additionally, the donor support must be capable of receiving on one surface a relatively thin coating of transferable organic material 730, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support can require a multistep cleaning and surface preparation process prior to precoating with transferable organic material. If the support material is a radiation-transmissive material, the incorporation into the support or onto a surface thereof, of a radiation-absorptive material can be advantageous to more effectively heat the donor support and to provide a correspondingly enhanced transfer of transferable organic material 730 from the donor 722 to the substrate, when using radiation from a suitable source, such as laser light from a suitable laser. The radiation-absorptive material 16 can be a dye such as the dyes specified in U.S. Pat. No. 5,578,416, a pigment such as carbon, or a metal such as nickel, chromium, titanium, etc. Donor 722 includes organic material 730 comprising light-emitting material as described above. Organic material 730 can have a high-contrast response, by which we mean that there is a small difference between the maximum intensity of radiation beam 718 at which no organic material transfer will occur, and the minimum intensity at which 100% organic material transfer will occur. This will generally mean that organic material 730 will undergo all or nothing transfer. Donor 722 can be in the form of individual sheets, or a continuous web.

Donor 722 is placed in a spaced relationship with laterally spaced electrode(s) 140. By a spaced relationship, we mean that donor 722 is placed in contact with hole-transporting layer 130, or is held with a gap of a controlled separation of less than 10 microns from electrodes 140, to facilitate radiation thermal transfer of organic material 730.

Radiation thermal transfer system 714 is representative of a single channel of a larger radiation thermal transfer system. In operation, radiation source 716 is activated and illuminates donor 722 in patterns corresponding to the area of laterally spaced electrodes 140 with radiation beam 718, which generates radiation spot 720. The majority of the radiation energy is absorbed by an absorber layer (not shown) within donor 722 and is converted to heat. This heats the organic material 730 of donor 722 and forms evaporated organic material 724, such that substantially all of organic material 730 is transferred onto the surface of hole-transporting layer 130 forming organic layer 726, which is representative of one or more layers of organic material as further detailed in FIG. 9.

Because radiation thermal transfer process 700 deposits organic material with a great deal of accuracy, it forms an organic layer 726 having a sharp edge taper region 728 that is less than 8 microns in width, and having corner radii of less than 6 microns. This resulting organic layer 726 has specific advantageous geometry that reduces the unutilized area 690, thereby permitting the reduction in spacing between laterally spaced electrodes 140, which can allow closer spacing between pixels, thereby improving the resolution of the OLED device.

Table 1 below illustrates a comparison between conventional electroless plated shadowmasking-based deposition processes (with a linear source), tapered shadowmask-based deposition processes (with a linear source), and a radiation thermal transfer process (e.g., radiation thermal transfer process 700) in regard to minimum required guardband of edges and corners.

TABLE 1

Aperture guardband range for disposition techniques

| | Electroless Plated Shadowmask with Linear Source | Tapered Shadowmask with Linear Source | Radiation Thermal Transfer |
|---|---|---|---|
| Edge | 15–30 micron | 8–10 micron | 3–6 micron |
| Corner radius | 5 micron | 16 micron | 5 micron |

Radiation thermal transfer process 700 can be repeated for e.g. depositing red-, green-, and blue-emitting organic material 730 by providing additional different donors 722 having different organic materials 730 and repeating radiation thermal transfer process 700.

Figure 8:
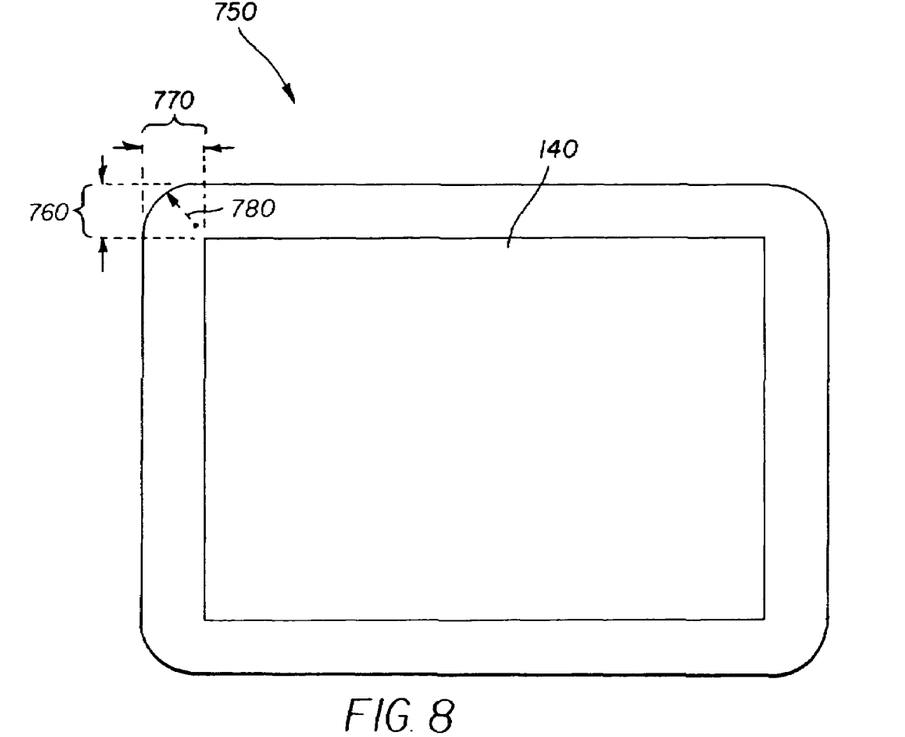
FIG. 8 shows a plan view of a deposition area formed by a method in accordance with this invention in relation to an associated electrode.

FIG. 8 shows a plan view of a deposition area 750 of organic layer 726, formed by a method in accordance with this invention, in relation to associated electrode 140. Deposition area is oversized by the dimensions depicted as guardband x 760 and guardband y 770. Guardband x 760 and guardband y 770 must be greater than or equal to the corresponding dimensions of edge taper region 728, and must also be sufficiently large to accommodate the loss of material due to the rounded edge of corner radius 780. As shown by Table 1, the guardband region can be significantly smaller than necessary for deposition pattern 300 or deposition area 500, thereby improving the aperture ratio of organic layer 726.

Figure 9:
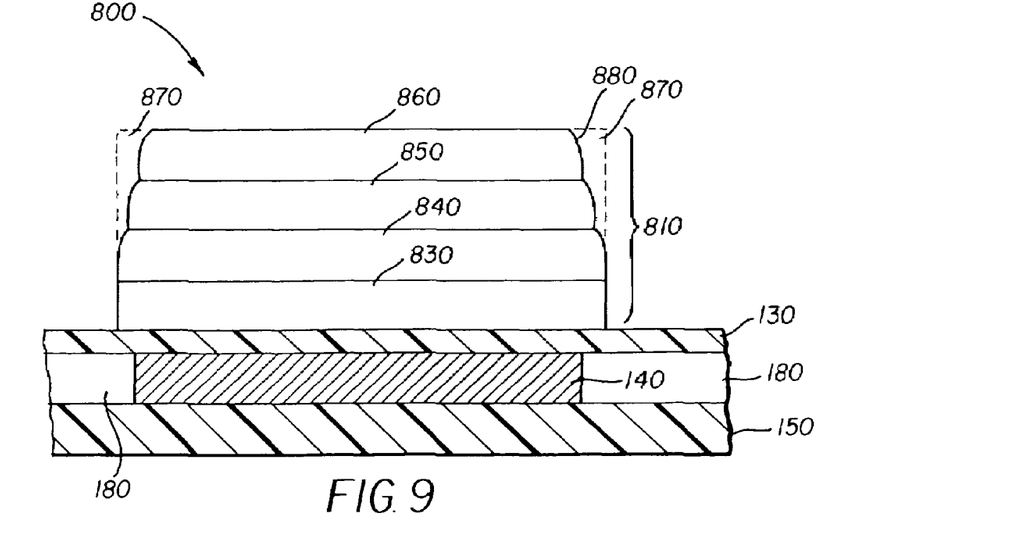
FIG. 9 shows a cross-sectional view of an improved multilayer OLED pixel formed via the method of the present invention.

FIG. 9 shows a cross-sectional view of an improved multilayer OLED pixel 800 formed via radiation thermal transfer process 700 of the present invention, as described in reference to FIG. 7. Improved multilayer OLED pixel 800 includes hole-transporting layer 130, electrode 140, substrate 150, and fill region 180, as described in reference to FIG. 1, and deposition structure 810 deposited upon hole-transporting layer 130. FIG. 9 illustrates that deposition structure 810 further includes an organic layer 830, an organic layer 840, an organic layer 850, an electrode 860, a void 870, and a sloping edge 880, such that organic layers 830, 840, and 850 are formed between laterally spaced electrodes 140 and vertically spaced apart electrode 860. In this example, hole-transporting layer 130, electrode 140, substrate 150, organic layer 830, organic layer 840, organic layer 850, and electrode 860 are conventional elements in OLED pixels as already described for OLED pixel 600.

Using radiation thermal transfer process 700, multiple layers of organic material are deposited upon electrode 140, e.g., organic layers 830, 840, and 850. Because radiation thermal transfer process 700 deposits organic layers upon each other with a great deal of accuracy, a negligible pyramid effect is formed in multiple depositions, forming an overall structure having edges 880 that are nearly orthogonal to substrate 150 and thus resulting in a void 870 that is of minimal volume, and sloping edge 880 that slants sharply as compared with the gradual slope seen in sloping edge 680 of FIG. 6. The resulting improved multilayer OLED structure 800 has specific advantageous geometry that minimizes both the deposition guardbanding requirements, as well as the deposition layer alignment tolerance. It can further allow pixels to be designed closer to each other, allowing for better resolution. The electrodes 140 can be designed to use a larger percentage of the OLED device area, allowing for a brighter display. Smaller pixels can be designed, allowing for better resolution.

Figure 10:
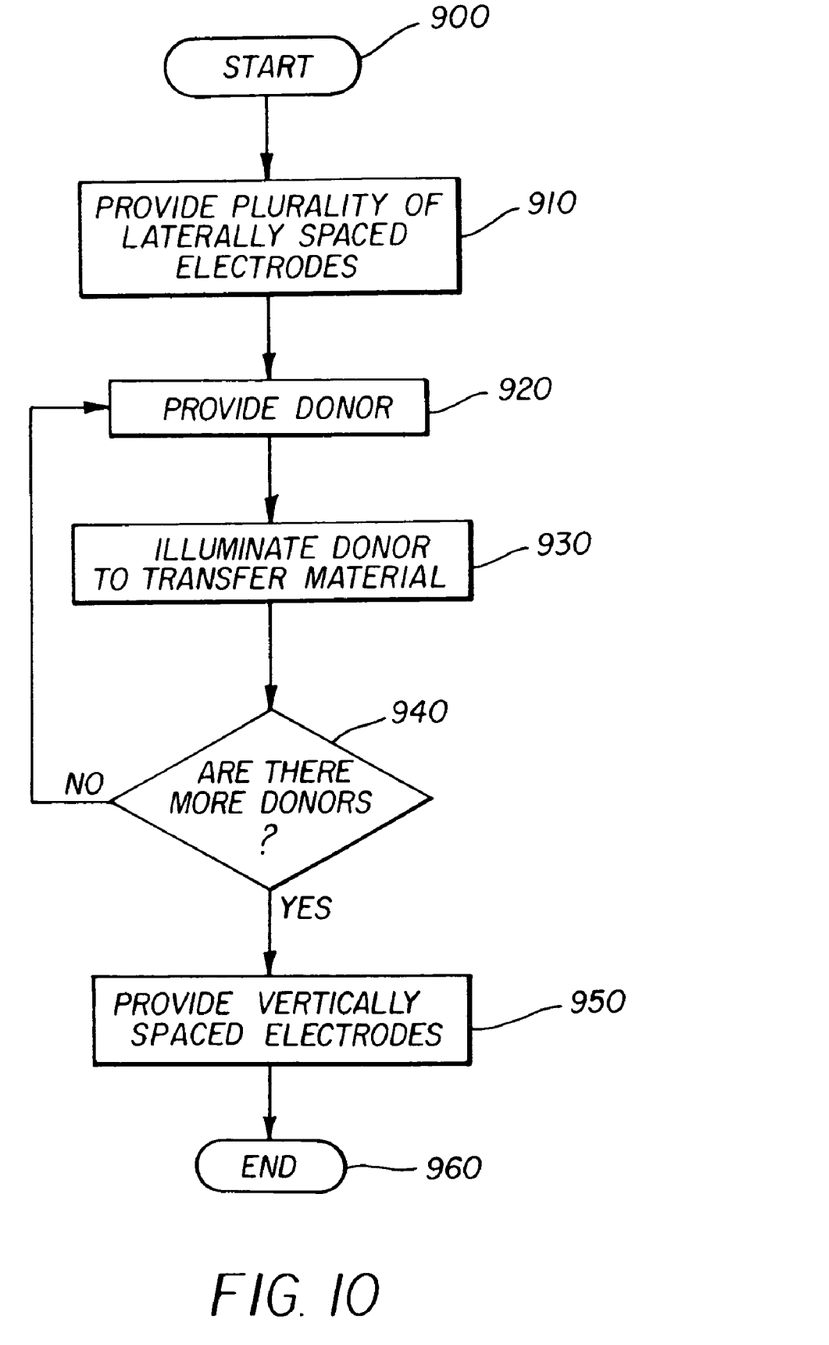
FIG. 10 is a block diagram of a method of improving the aperture ratio or resolution of an OLED device in accordance with this invention.

Turning now to FIG. 10, and referring also to FIG. 7, there is shown a block diagram of a method of improving the aperture ratio or resolution of an OLED device in accordance with this invention. At the start (step 900), a plurality of laterally spaced electrodes 140 is provided on a substrate 150 (step 910). A donor 722 having a transferable organic material 730 is provided in a spaced relationship with laterally spaced electrodes 140 (step 920). The donor 722 is then illuminated with radiation, such as radiation beam 718, in patterns corresponding to the area of laterally spaced electrodes 140 to transfer organic material 730 over the laterally spaced electrodes 140 such that substantially all of the organic material 730 is transferred and the edge taper region 728 is less than 8 microns and the corner radii are less than 6 microns (step 930). If additional different donors having different organic materials are to be used, for example to deposit organic material of different emission wavelengths (step 940), steps 920 and 930 are repeated as necessary. If no further donors are required, an electrode vertically spaced from the laterally spaced electrodes 140 is provided (step 950). The method then ends (step 960).

The invention has been described in detail with particular reference to certain preferred embodiments thereof, but it will be understood that variations and modifications can be effected within the spirit and scope of the invention. For example, although the OLED devices with edge taper region less than 8 microns or corner radii less than 6 microns, or both, have been described as being made with the described thermal transfer method, those skilled in the art will appreciate that other methods can be used to accomplish edge taper regions less than 8 microns or corner radii less than 6 microns, or both. For example, the method described by Tang in U.S. Pat. No. 5,937,272 utilizes an aperture mask in combination with a large area source in the form of a donor support coated with a transferable coating of an organic EL material. By proper selection of the type of aperture mask and D, the distance between the donor and the aperture mask, such that D is small enough to minimize high angle depositions, OLED devices with edge tapers less than 8 microns or corner radii less than 6 microns, or both, can be achieved.

Another type of large area source has been described by Schwambera et al. in "Modeling and Fabrication of Organic Vapor Phase Deposition (OVPD) Equipment for OLED Display Manufacturing," Society for Information Display 2002 Annual Meeting Digest, p894. A combination of this source with the proper aperture mask and the correct spacing and flow rates can provide another method for producing OLED devices with edge taper less than 8 microns or corner radii less than 6 microns, or both.

Finally, proper selection of tapered mask design and/or OLED device design can also result in OLED devices with edge taper less than 8 microns or corner radii less than 6 microns, or both. For example, etching masks for tapered masks can include a corner modification such that the final etched corner of the taper mask results in corner radii less than 6 microns. Alternatively, the OLED device design can utilize a striped color pattern such that tapered slotted masks can be used, thereby eliminating the corner radii issue.

| PARTS LIST | |
|---|---|
| 100 | partial OLED device |
| 110 | shadowmask |
| 115 | deposition area |
| 120 | linear source |
| 130 | hole-transporting layer |
| 140 | laterally spaced electrode |
| 150 | substrate |
| 160 | organic layer |
| 170 | uniform region |
| 175 | edge taper region |
| 180 | fill region |
| 210 | shadowmask aperture |
| 220 | guardband x |
| 230 | guardband y |
| 300 | deposition pattern |
| 350 | plot |
| 360 | profile curve |
| 400 | partial OLED device |
| 410 | shadowmask |
| 460 | organic layer |
| 470 | uniform region |
| 475 | edge taper region |
| 500 | deposition area |
| 510 | shadowmask aperture |
| 520 | guardband x |
| 530 | guardband y |
| 540 | corner radius |
| 600 | OLED pixel |
| 630 | organic layer |
| 640 | organic layer |
| 650 | organic layer |
| 660 | electrode |
| 670 | void |
| 680 | edge |
| 690 | unutilized area |
| 700 | radiation thermal transfer process |
| 714 | radiation thermal transfer system |
| 716 | radiation source |
| 718 | radiation beam |
| 720 | radiation spot |
| 722 | donor |
| 724 | evaporated organic material |
| 726 | organic layer |
| 728 | edge taper region |
| 730 | organic material |
| 750 | deposition area |
| 760 | guardband x |
| 770 | guardband y |
| 780 | corner radius |
| 800 | OLED pixel |
| 810 | deposition structure |
| 830 | organic layer |
| 840 | organic layer |
| 850 | organic layer |
| 860 | electrode |
| 870 | void |
| 880 | edge |
| 900 | block |
| 910 | block |
| 920 | block |
| 930 | block |

-continued

| PARTS LIST | |
|---|---|
| 940 | decision block |
| 950 | block |
| 960 | block |

What is claimed is:

1. In a method of improving the aperture ratio or resolution of an OLED device which includes a plurality of laterally spaced electrodes and one or more electrodes vertically spaced apart from the plurality of laterally spaced electrodes, the improvement comprising:
  a) providing a donor having transferable organic material in a non-contact spaced relationship with the laterally spaced electrodes; and
  b) illuminating the donor with radiation in patterns corresponding to the area of the laterally spaced electrodes to transfer organic material over the laterally spaced electrodes such that substantially all of the organic material is transferred and the edge taper region of the organic material is less than 8 microns thereby permitting the reduction in spacing between the laterally spaced electrodes and improvement in the aperture ratio, the resolution, or both, of the OLED device.

2. In a method of improving the aperture ratio or resolution of an OLED device which includes a plurality of laterally spaced electrodes and one or more electrodes vertically spaced apart from the plurality of laterally spaced electrodes, the improvement comprising:
  a) providing a donor having transferable organic material in non-contact spaced relationship with the laterally spaced electrodes; and
  b) illuminating the donor with radiation in patterns corresponding to the area of the laterally spaced electrodes to transfer organic material over the laterally spaced electrodes such that substantially all of the organic material is transferred and the edge taper region of the organic material is less than 8 microns and the corner radii of the organic material are less than 6 microns thereby permitting the reduction in spacing between the laterally spaced electrodes and improve the aperture ratio or resolution of the OLED device.

3. The method of claim 2 further including the step of providing one or more different donors having different organic materials and repeating elements a) and b).

4. In a method of improving the aperture ratio or resolution of an OLED device which includes a plurality of laterally spaced electrodes and one or more electrodes vertically spaced apart from the plurality of laterally spaced electrodes, the improvement comprising:
  a) providing a donor having transferable organic material in non-contact spaced relationship less than 10 microns from the laterally spaced electrodes, the organic material having a high-contrast response; and
  b) illuminating the donor with radiation in patterns corresponding to the area of the laterally spaced electrodes to transfer organic material over the laterally spaced electrodes such that substantially all of the organic material is transferred and the edge taper region of the organic material is less than 8 microns and the corner radii of the organic material are less than 6 microns thereby permitting the reduction in spacing between the laterally spaced electrodes and improve the aperture ratio or resolution of the OLED device.

5. The method of claim 4 further including the step of providing one or more different donor elements having different organic materials and repeating elements a) and b).

6. The method of claim 1 wherein the OLED device is an active matrix device and the laterally spaced electrodes each corresponds to a pixel and there is a single vertically spaced apart electrode from the laterally spaced electrodes.

* * * * *